United States Patent [19]
Austin et al.

[11] Patent Number: 6,009,139
[45] Date of Patent: Dec. 28, 1999

[54] ASYNCHRONOUSLY PROGRAMMABLE FREQUENCY DIVIDER CIRCUIT WITH A SYMMETRICAL OUTPUT

[75] Inventors: John S. Austin, Winooski; Ram Kelkar, South Burlington, both of Vt.

[73] Assignee: International Business Machines Corporation, Armonk, N.Y.

[21] Appl. No.: 09/100,541

[22] Filed: Jun. 19, 1998

[51] Int. Cl.[6] ............................................. H03K 21/00
[52] U.S. Cl. ........................ 377/47; 327/115; 327/147; 327/156
[58] Field of Search ........................ 377/47; 327/115, 327/147, 156

[56] References Cited

U.S. PATENT DOCUMENTS

| Re. 32,605 | 2/1988 | Yamashita et al. | 377/47 |
|---|---|---|---|
| 2,827,566 | 3/1958 | Lubkin | 250/27 |
| 3,484,699 | 12/1969 | Israel | 328/46 |
| 4,390,960 | 6/1983 | Yamashita et al. | 377/54 |
| 4,468,797 | 8/1984 | Shin | 377/52 |
| 4,606,059 | 8/1986 | Oida | 377/47 |
| 4,715,052 | 12/1987 | Stambaugh | 377/108 |
| 4,947,411 | 8/1990 | Shiraishi et al. | 377/47 |
| 5,337,339 | 8/1994 | Hillstrom | 377/54 |
| 5,359,635 | 10/1994 | Atriss et al. | 377/39 |
| 5,835,551 | 11/1998 | Kawarazaki | 377/54 |

*Primary Examiner*—Margaret R. Wambach
*Attorney, Agent, or Firm*—Schmeiser, Olsen & Watts; Eugene I. Shkurko

[57] ABSTRACT

A programmable divider circuit having an adjustable shift register is coupled to a clock and to an output. The shift register receives a clock signal having a clock signal frequency and outputs an output signal with an output frequency corresponding to a user selected divide ratio of the clock signal frequency. Control inputs are coupled to the adjustable shift register to receive control data for adjusting a length of the shift register, the length of the shift register corresponding to the user selected divide ratio.

20 Claims, 5 Drawing Sheets

ASYNCHRONOUSLY PROGRAMMABLE FREQUENCY DIVIDER CIRCUIT WITH A SYMMETRICAL OUTPUT

BACKGROUND OF THE INVENTION

1. Technical Field

The invention relates generally to integrated circuits, and more specifically, to programmable dividers for integrated circuits.

2. Background Art

In Phase-Locked Loop (PLL) circuits and similar circuits used for frequency-synthesis applications, divider circuits are used to divide the input signals to achieve a desired output frequency. In order to provide a divider circuit, a binary counter is traditionally used to implement the divide ratio of the divider. Examples of dividers using binary counters are disclosed in U.S. Pat. No. 4,606,059 and U.S. Pat. No. Re. 32,605, incorporated herein by reference. Although binary counters effectively divide the input clocks in the aforementioned patents, binary counters may require a relatively large amount of space, especially for a wide range of divide options. Furthermore, increasing the range of desired output frequencies for a conventional divider circuit could substantially increase the amount of space for the divider circuit, depending upon the divide ratio bits used for the binary counter.

SUMMARY OF THE INVENTION

It is thus an advantage of the present invention to provide a programmable divider for an integrated circuit such as a phase-locked loop circuit that eliminates the above described disadvantages.

The advantages of the invention are realized by a divider having an adjustable shift register. The shift register is coupled to a clock and to an output for receiving a clock signal having a clock signal frequency and for outputting an output signal with an output signal frequency corresponding to a user selected divide ratio of the clock signal frequency. Control inputs are coupled to the adjustable shift register to receive control data for adjusting a length of the shift register, the length of the shift register corresponding to the user selected divide ratio.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
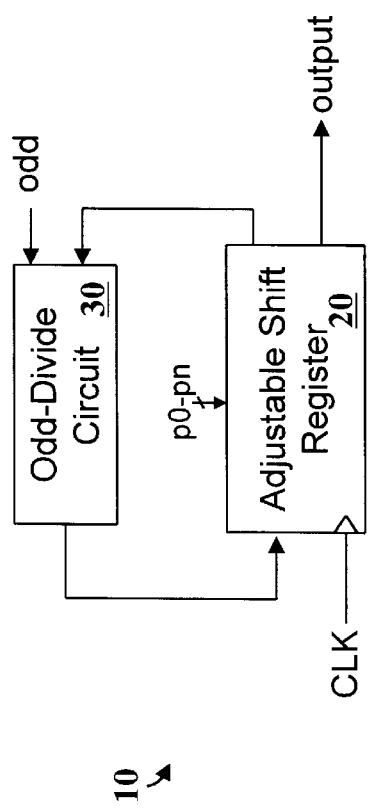
FIG. 1 is a block diagram of a programmable divider in accordance with a first embodiment of the present invention.

Referring to FIG. 1, a block diagram of a programmable divider 10 in accordance with a first embodiment of the present invention is shown. Divider 10 includes an adjustable shift register 20, and an odd-divide circuit 30. An input clock pulse (CLK), programmable inputs p0–pn, and the output from odd-divide circuit 30 are inputted into adjustable shift register 20. Adjustable shift register 20 adjusts in length as determined by programmable input bits p0–pn. Adjustable shift register 20 then outputs an output signal having a frequency divide ratio of CLK corresponding to programmable input bits. Odd-divide circuit 30 allows for a divide ratio of an odd number, such as 7, 5, 3 etc., determined by programmable input bit ODD. The programmable input bits are easily programmable by a user since the divide ratio may be programmed asynchronously. Also, although the programmable inputs may be user selected, software programs may be used to select appropriate inputs.

As will be seen in subsequent figures, the adjustable shift register and odd-divide circuit of the present invention are more compact and use less space than the traditional counter. Furthermore, the programmable divider in accordance with the present invention is capable of meeting the maximum frequency of the current technology (e.g., at least 1 gigahertz (GHz) in a 0.18 micron ($\mu$) technology).

Figure 2:
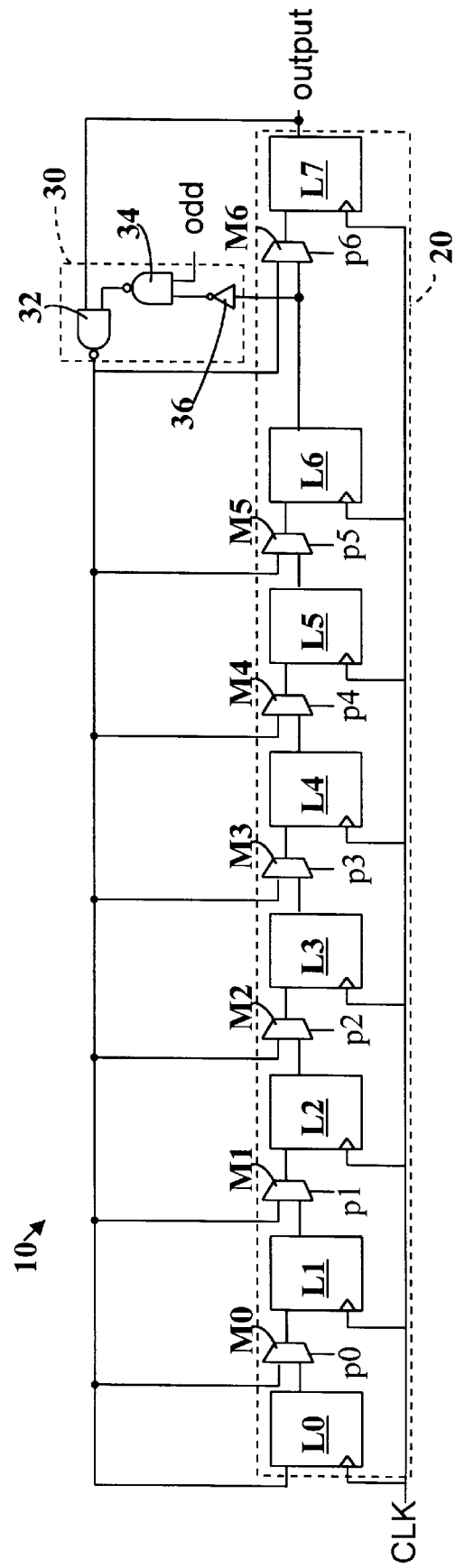
FIGS. 2 and 3 are exemplary circuit diagrams of the block diagram of FIG. 1.
Figure 3:
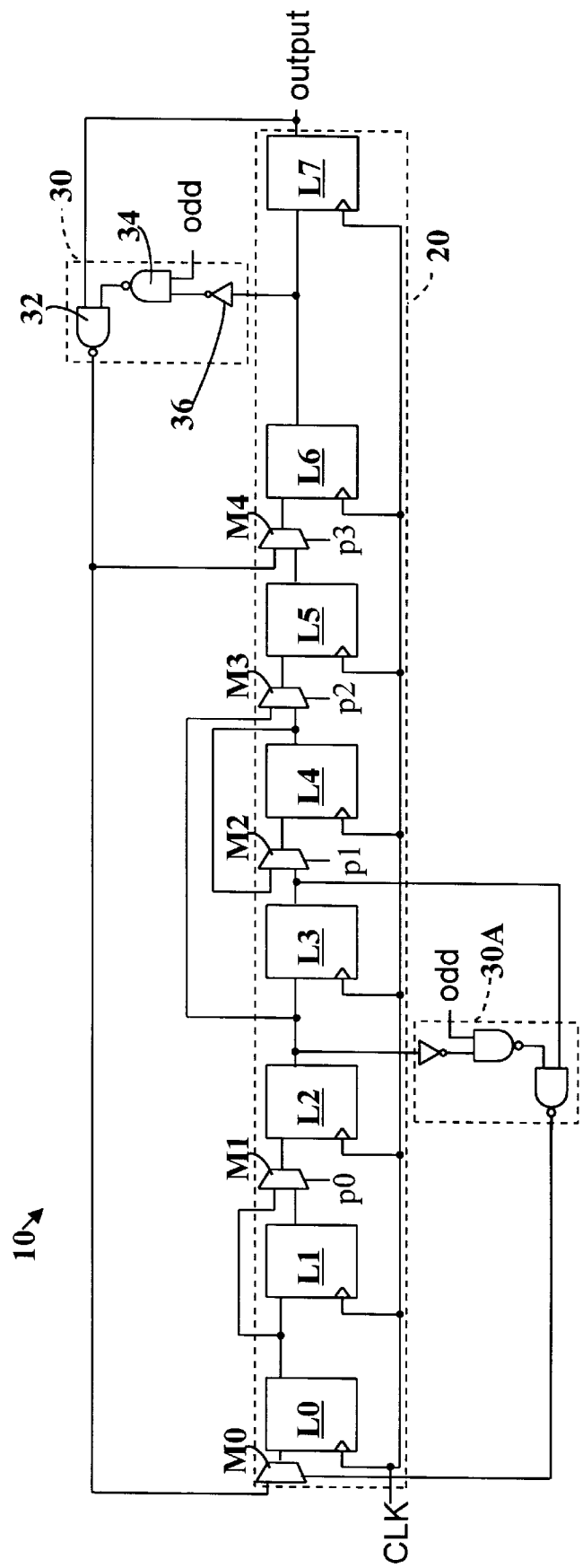

Referring to FIGS. 2 and 3, exemplary circuit diagrams for a programmable divider in accordance with the present invention are shown. The divider circuit 10 of FIG. 2 comprises adjustable shift register 20 and odd-divide circuit 30 and provides a divide ratio in the range of 2 to 16. In this example, adjustable shift register 20 comprises eight latches L0–L7, and seven control inputs, such as MUX elements M0–M6. Although specific elements are used for this and other examples of the present invention, such as latches, MUX elements, inverters, NAND gates, etc., it is to be understood that other elements of similar functionality may also be used.

The input clock CLK is applied at the clock inputs of L0–L7. The outputs of L0–L6 are applied to the second inputs of M0–M6, respectively. The output of odd-divide circuit 30 is applied to the first inputs of M0–M6. Programmable input bits p0–p6, (control data) which may be user-programmable, are applied to the select pins of M0–M6, respectively. The outputs of M0–M7 are thus determined by the programmable input bits p0–p6. Although seven programmable input bits, MUX elements, and eight latches are used specifically for this example, it is to be understood that any other appropriate amount of elements may be used for adjustable shift register 20 (as will be seen in reference to FIGS. 3 and 5).

Odd-divide circuit 30 comprises NAND gates 32 and 34 and inverter 36. The output of L6 is inputted into inverter 36. The output of inverter 36 and programmable input bit "odd" are inputted into NAND gate 34. The output of NAND gate 34 and L7 are then inputted into NAND gate 32. L0 and M0–M6 receive the output of NAND gate 32.

In operation, programmable input bits p0–p6 determine the latches to be used to produce the desired divide ratio. For example, if a divide-by-8 divide ratio is desired, a 4-latch register would be used (i.e., L4–L7). That is, programmable input bits p4–p6 would select the second inputs to M4–M6, respectively, and programmable input bit p3 would select the first input of M3, thus including latches L4–L7 for the count range while by-passing L0–L3. Each clock pulse would then shift the input bits of the present state of the selected latches to the right. L4 would receive the output of odd-divide circuit 30. In this example (as with any even divide ratio) odd-divide circuit 30 would act as an inverter of the output since the "odd" input would be 0.

For an odd divide ratio, the "odd" input would be set to 1. For example, for a divide-by 9 divide ratio, a 5-latch register would be used (i.e., L3–L7) and the "odd" input would be set to 1. In this case, the odd-divide circuit 30 will sense and skip the all zero state, thus skipping one of the states usually present in a divide-by 10 divide ratio.

FIG. 3 is similar to FIG. 2, except two odd-divide circuits 30 and 30A are used to increase the speed of the programmable divider 10. As seen in FIG. 3, the loading on NAND gate 32 (odd-divide circuit 30) is reduced by adding a second odd-divide circuit 30A. The divider circuit 10 comprises adjustable shift register 20 and odd-divide circuits 30 and 30A and, as with FIG. 2, provides a divide ratio in the range of 2 to 16. In this example, adjustable shift register 20 comprises eight latches L0–L7, and five MUX elements M0–M4.

The input clock CLK is applied at the clock inputs of L0–L7. The outputs of L1, L3, L4, and L5 are applied to the second inputs of M1–M4, respectively. The outputs of L0, L2, and L6 are applied to the inputs of L1, L3, and L7, respectively. The output of L0, L2 and L4 are also applied to the first inputs of M1, M3 and M2, respectively. The output of odd-divide circuit 30 is applied to the first inputs of M0 and M4. The output of odd-divide circuit 30A is applied to the second input of M0. Programmable input bits p0–p4 are applied to the select pins of M0–M4, respectively. The output of L6 and the output of L7 provide the inputs for odd-divide circuit 30, and the outputs of L2 and L3 provide the inputs for odd-divide circuit 30A.

In operation, the frequency divide function is implemented through a shift-register loop. This loop consists of a chain of latches where the output of the last latch (e.g. L7) is inverted through odd-divide circuit (30) and fed back to the input of the first latch (e.g., L0). The length of this chain (i.e., the number of latches) determines, in part, the divide ratio. Not all the latches in FIG. 3 are part of the chain in the shift-register loop. Depending on the divide ratio, some of the latches may be unused and some of the latches may be used to simply pass data from the shift-register loop to the output of the divider circuit.

TABLE I

| Divide ratio | Latches | | | | | | | |
|---|---|---|---|---|---|---|---|---|
| | L0 | L1 | L2 | L3 | L4 | L5 | L6 | L7 |
| 2 | | | | | D | p | p | p |
| 4, 3 | | | | | | | D | D |
| 6, 5 | D | | D | D | p | p | p | p |
| 8, 7 | D | D | D | D | p | p | p | p |
| 10, 9 | D | | D | | | D | D | D |
| 12, 11 | D | D | D | | | D | D | D |
| 14, 13 | D | | D | D | D | D | D | D |
| 16, 15 | D | D | D | D | D | D | D | D |

D = latches divide
p = latches pass through

Table 1 illustrates the operations of the eight latches of the adjustable shift register 20 corresponding to divide ratios 2–16. The left hand side indicates the factor by which the frequency of the input signal is divided. The right hand side of the table lists the latches and indicates how they are used. Designation "D" indicates that the latch is part of the shift-register loop. Designation "p" indicates that the latch is not part of the shift-register loop but is used to pass data from the shift-register loop to the output of the circuit. No designation indicates that the latch is unused, that is, it is present in the circuit but is bypassed.

The latches used in divider circuit 10 have a master/slave relationship consisting of two latching elements (not shown) wherein a low clock polarity will load data from a data pin into the first latching element, and a high clock polarity will shift the data from the first latching element into the second latching element and out of the latch.

Figure 4:
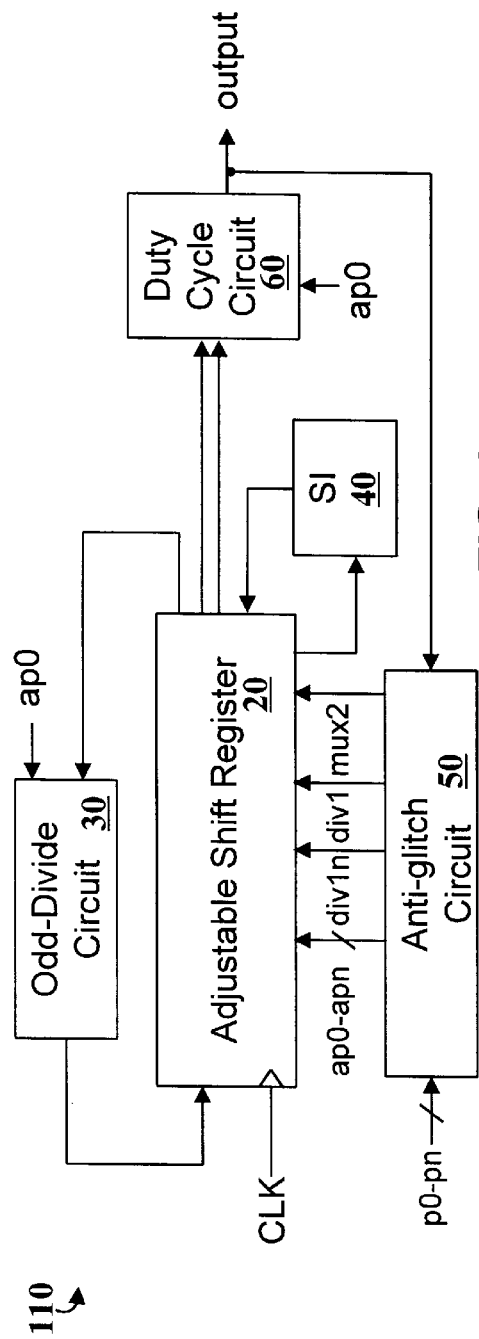
FIG. 4 is a block diagram of a programmable divider in accordance with a preferred embodiment of the present invention.

FIG. 4 illustrates a block diagram of a programmable divider 110 in accordance to a preferred embodiment of the present invention. Divider 110 includes an adjustable shift register 20, odd-divide circuit 30, self-initialization (SI) circuit 40, anti-glitch circuit 50 and duty cycle circuit 60. Programmable inputs p0–pn and the symmetrical output (i.e., output duty cycle is 50%) from duty cycle circuit 60 are inputted into anti-glitch circuit 50, which in turn outputs control inputs ap0–apn, divide-by-1 (div1), divide-by-1n (div1n), and mux2. An input clock pulse (CLK), control inputs ap0–apn, div1, div1n and mux2, the output of odd-divide circuit 30, and the output of SI 40 are inputted into adjustable shift register 20. Odd-divide circuit 30 receives an output from adjustable shift register 20 and control input ap0. Duty cycle circuit 60 receives inputs from adjustable shift register 20 and control input ap0, and outputs the programmable divider output (OUTPUT).

Adjustable shift register 20 adjusts in length as determined by programmable input bits p0–pn. Adjustable shift register 20 then outputs an output signal having a frequency divide ratio of CLK corresponding to programmable input bits. As aforementioned, duty cycle circuit 60 provides a symmetrical (output duty cycle is 50%) output for programmable divider 110. Odd-divide circuit 30 allows for a divide ratio of an odd number, such as 7, 5, 3 etc., determined by control input bit ap0. Anti-glitch circuit 50 provides for a glitch-free output clock, even if the divide ratio is changed in the middle of a cycle. Thus, the anti-glitch circuit 50 allows the output clock to run devices, such as logic driving a video D/A converter, that depend on a glitch-free clocks to remain operational.

SI 40 prevents adjustable shift register 20 from entering a "bad" state by automatically steering the shift register to another state. That is, SI 40 detects an inoperative state of adjustable shift register 20 and provides a signal to the adjustable shift register 20 to shift the register 20 into an operative state in response to detecting the inoperative state. As with FIG. 1, the programmable input bits of the present invention are easily programmable by a user since the divide ratio may be programmed asynchronously. Also, although the programmable inputs may be user selected, software programs may be used to select appropriate inputs.

Figure 5:
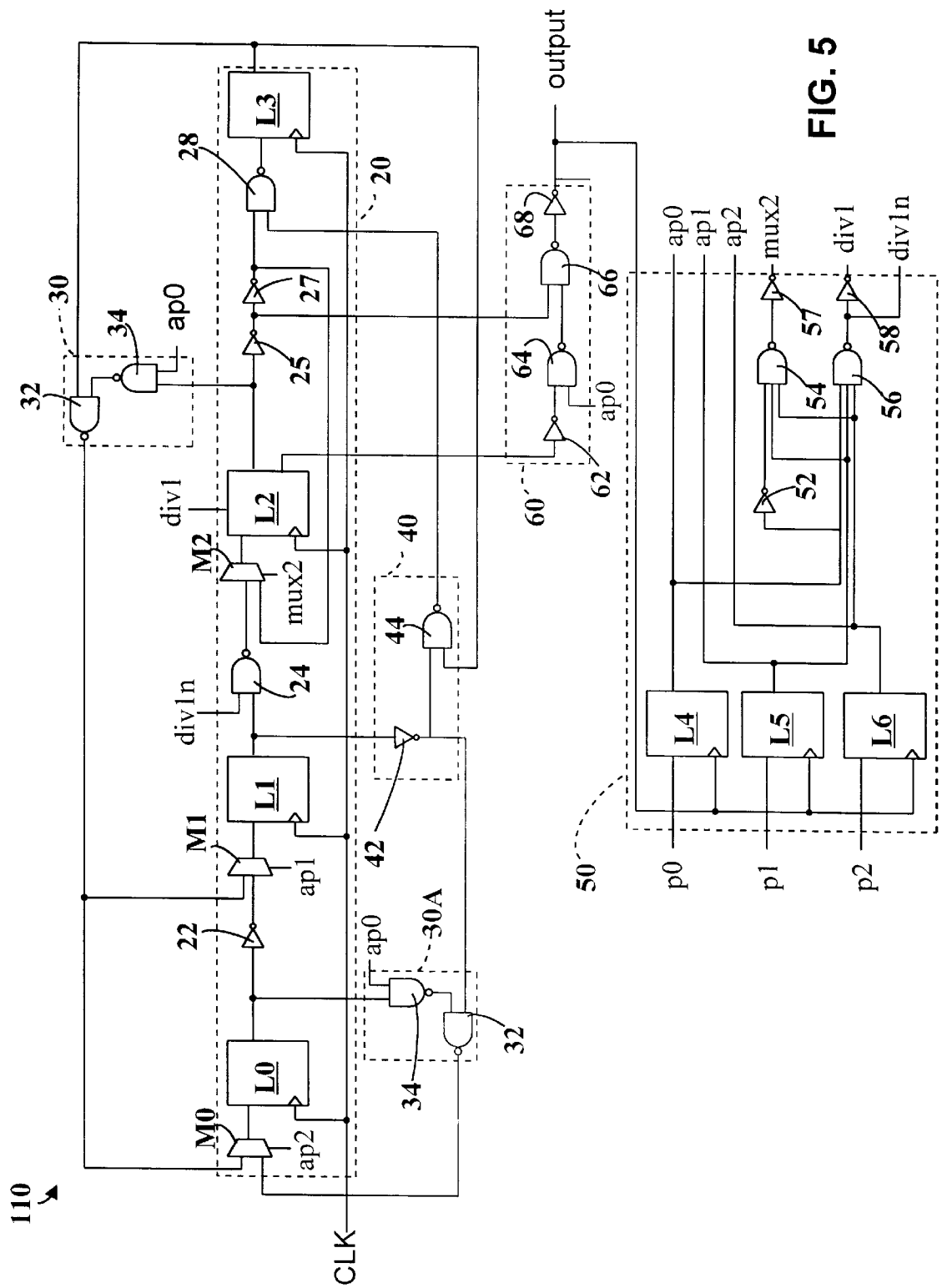
FIG. 5 is an exemplary circuit diagram of the block diagram of FIG. 4.

Referring to FIG. 5, an exemplary circuit diagram for a programmable divider 110 of FIG. 4 is shown. The divider circuit 110 of FIG. 5 comprises adjustable shift register 20, odd-divide circuits 30 and 30A, SI 40, anti-glitch circuit 50 and duty cycle circuit 60 and provides a divide ratio in the range of 1 to 8. In this example, adjustable shift register 20 comprises four latches L0–L3, and three MUX elements M0–M2. L0, L1 and L3 are similar, wherein they have approximately the same structure as the latches described in FIG. 3. L2 is similar to the L0, L1 and L3, except that it includes a second input and a second output to be discussed below. Adjustable shift register 20 also comprises inverters 22, 25 and 27 and NAND gates 24 and 28.

The input clock CLK is applied at the clock inputs of L0–L3. The outputs of odd-divide circuit 30 and 30A are applied to the first and second inputs of M0, respectively. The output of odd-divide circuit 30 is also applied to the first input of M1. The outputs of M0–M3 are applied to the inputs of L0–L3, respectively. The output of L0 is inputted into odd-divide circuit 30A and inverter 22, which in turn is inputted into the second input of M1. The output of L1 is inputted into SI 40 and NAND gate 24. Anti-glitch circuit inputs div1n into the second input of NAND gate 24, div1 into the second input of L2, and mux2 into the select bit of M2. L2 outputs a first output to odd-divide circuit 30 and to NAND gate 28 through inverters 25 and 27, and L2 outputs a second output to duty cycle circuit 60. NAND gate 28 also receives an input from SI 40 and outputs to L3. L3 outputs a signal to odd-divide circuit 30 and SI 40.

Odd-divide circuits 30 and 30A comprise NAND gates 32 and 34. The output of L0 and control input bit ap0 are inputted into NAND gate 34 of circuit 30A and the output of L2 and control input bit ap0 are inputted into NAND gate 34 of circuit 30. The output of NAND gate 34 and inverted output of L1 are then inputted into NAND gate 32 of circuit 30A, and the output of NAND gate 34 and L3 are inputted into NAND gate 32 of circuit 30. The outputs of NAND gates 32 are then inputted into the first and second input of M0.

SI 40 comprises inverter 42 and NAND gate 44. Inverter 42 inputs the inverted output of L1 into a first input of NAND gate 44. The output of L3 is applied to the second input of NAND gate 44. The output of NAND gate 44 is inputted into NAND gate 28. As aforementioned, SI 40 detects an inoperative state of adjustable shift register 20 and provides a signal to the adjustable shift register 20 to shift the register 20 into an operative state in response to detecting the inoperative state.

Anti-glitch circuit 50 comprises latches L4–L6, inverters 52, 57 and 58, and NAND gates 54 and 56. L4–L6 are clocked through the output clock (OUTPUT). Programmable bits p0–p2 are applied to the inputs of L4–L6. The outputs of L4–L6 (control inputs ap0, ap1 and ap2, respectively) are inputted into adjustable shift register 20, and odd-divide circuits 30 and 30A. Ap0, ap1, and ap2 are also applied to the inputs of NAND gate 56, and ap1, ap2 and inverted ap0 are applied to the inputs of NAND gate 54. The output of NAND gate 54 is inverted through inverter 57, outputting the signal mux2. The output of NAND gate 56 provides the signal div1n, and inverted through inverter 58, provides the control signal div1. Control signals div1 and div1n from anti-glitch circuit 50 allow for the divide-by-1-ratio for the divider circuit. That is, when div1 is applied into the aforementioned second input of L2, the first output of L2 will pass the clock signal instead of the data signal through the latch.

Duty-cycle circuit 60 comprises inverters 62 and 68, and NAND gates 64 and 66. NAND gate 64 receives the control input ap0 and an inverted first output of L2 through inverter 62. NAND gate 66 receives the output of NAND gate 64 and an inverted second output of L2 through inverter 25. The second output of L2 will pass the data stored in the first latching element, which leads the data at the first output of L2 (from the second latching element ) by ½ clock cycle. The first and second outputs of L2 are then inputted into duty-cycle circuit 60, which then produces an output having a 50% duty cycle. Duty-cycle circuit 60 thus provides a symmetrical output.

The operation of adjustable shift register 20 of FIG. 5 is similar to that of adjustable shift registers 20 of FIG. 2 and FIG. 3, wherein programmable input bits p0–p2, after being latched by anti-glitch circuit 50, determine the shift register latches to be used to produce the desired divide ratio.

Figure 6:
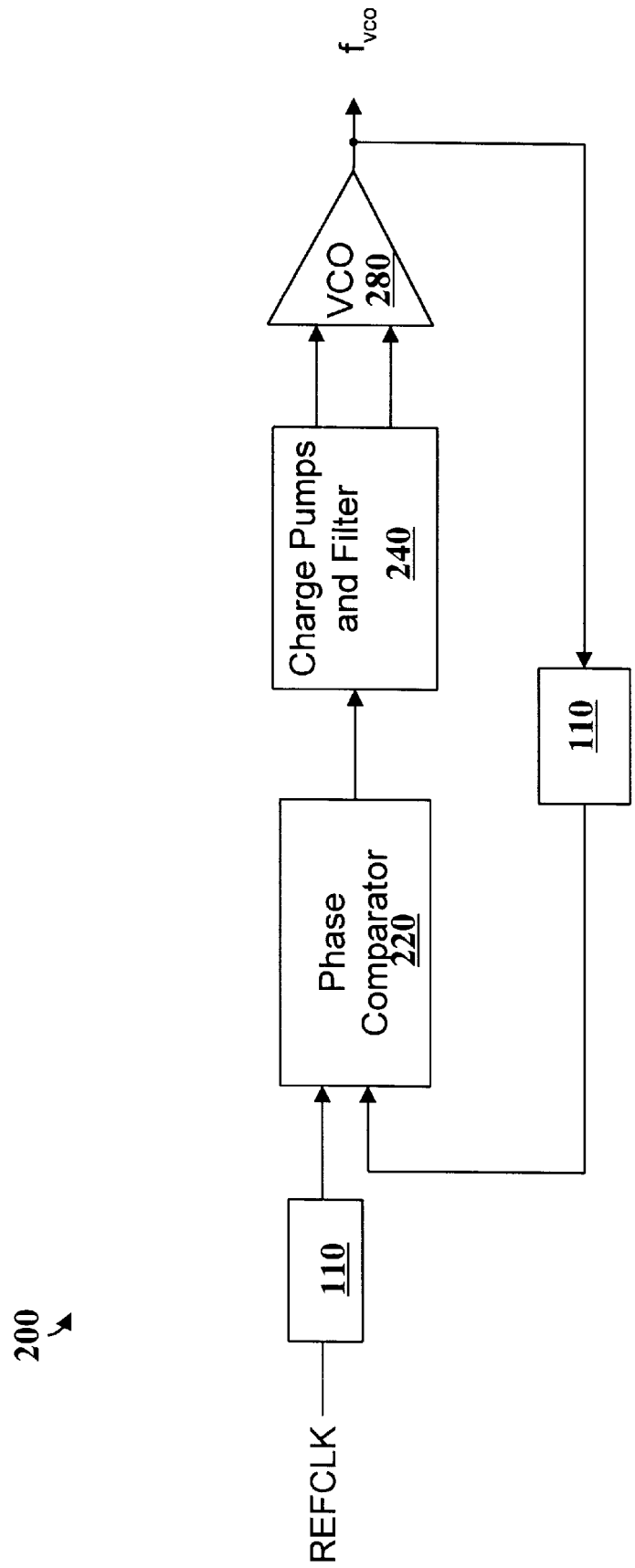
FIG. 6 is a block diagram of a phase-locked loop circuit using the programmable divider of FIG. 4.

As seen in FIG. 6, divider circuit 110 from FIG. 4 may be used in an exemplary PLL circuit 200. In this example, PLL circuit 200 includes two divider circuits 110 and 110A, each divider circuit programmed for different divide ratios. PLL circuit 200 also includes phase comparator 220, charge pumps and filter 240, and voltage-controlled oscillator (VCO) 280. A reference clock REFCLK is applied to divider circuit 110, which outputs a divided REFCLK signal to phase comparator 220. Divider circuit 110A, which is used in the feedback loop of the PLL circuit, also outputs a divided frequency signal to phase comparator 220, the frequency signal being supplied by VCO 280. Phase comparator 220 compares the two outputs from divider circuit 110 and divider circuit 110A and outputs a signal to the charge pumps and filter 240, which then outputs signals to VCO 280. A signal with the frequency ($f_{VCO}$) of VCO 280 is then outputted.

Thus, the programmable, self-initializing divider according to the present invention provides a wide range of divide ratios for a substantially compact area. The divide ratios may also be inputted asynchronously. The dividers are also symmetrical, wherein the output duty cycle is 50%. Also, because the divider is self-initializing and provides for glitches, the divider provides stability and operability for any state.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus comprising:
    an adjustable shift register coupled to a clock and to an output for receiving a clock signal having a clock signal frequency and for outputting an output signal with an output frequency corresponding to a user selected divide ratio of the clock signal frequency; and
    control inputs coupled to the shift register for receiving control data for adjusting a length of the shift register, the length of the shift register corresponding to the user selected divide ratio.

2. The apparatus of claim 1, further comprising:
    latches; and
    multiplex elements for selectively bypassing the latches in response to the control data to affect said adjusting the length of the adjustable shift register.

3. The apparatus of claim 1, further comprising:
    a duty cycle circuit for maintaining about a 50% duty cycle of the output signal for any user selected divide ratio.

4. The apparatus of claim 1, further comprising:
    an odd-divide circuit for skipping a logic state of the adjustable shift register in response to the control data indicating an odd divide ratio.

5. The apparatus of claim 4, wherein said odd-divide circuit further comprises at least one NAND gate.

6. The apparatus of claim 1, wherein the user selected divide ratio is changed asynchronously to the clock signal and the output signal.

7. The apparatus of claim 1, further comprising:
    an anti-glitch circuit, coupled to said adjustable shift register for providing a glitch-free output signal.

8. The apparatus of claim 1, further comprising:
    a self-initialization circuit, coupled to said adjustable shift register, for preventing the adjustable shift register from entering into an inoperative state.

9. A method for dividing an input clock signal comprising the steps of:
   a) coupling an adjustable shift register to a clock and to an output;
   b) inputting control data corresponding to a divide ratio into the adjustable shift register;
   c) adjusting a length of the adjustable shift register with said control data;
   d) inputting a clock signal from the clock into the adjustable shift register; and
   e) outputting an output signal corresponding to the divide ratio of the clock signal.

10. The method of claim 9, wherein step c) further comprises the steps of:
   c1) providing latches and multiplex elements for the adjustable shift register; and
   c2) selectively bypassing some of the latches in response to the control data to affect the adjusting the length of the shift register.

11. The method of claim 9, further comprising the step of:
   maintaining about a 50% duty cycle of the output signal for any divide ratio.

12. The method of claim 9, further comprising the step of:
   skipping a logic state of the adjustable shift register in response to the control data indicating an odd divide ratio.

13. The method of claim 9, wherein step b) further comprises the step of:
   b1) changing the divide ratio asynchronously to the clock signal and the output signal.

14. A Phase-Locked Loop (PLL) circuit comprising:
   an adjustable shift register coupled to a clock and to an output for receiving a clock signal having a clock frequency and for outputting an output signal with an output frequency corresponding to a user selected divide ratio of the clock signal frequency;
   control inputs coupled to the shift register for receiving control data for adjusting a length of the shift register, the length of the shift register corresponding to the user selected divide ratio; and
   a phase comparator for receiving the output signal.

15. The PLL circuit of claim 14, further comprising:
   latches; and
   and multiplex elements for selectively bypassing some of the latches in response to the control data to affect said adjusting the length of the adjustable shift register.

16. The PLL circuit of claim 14, further comprising:
   a duty cycle circuit for maintaining about a 50% duty cycle of the output signal for any user selected divide ratio.

17. The PLL circuit of claim 14, further comprising:
   an odd-divide circuit for skipping a logic state of the adjustable shift register in response to the control data indicating an odd divide ratio.

18. The PLL circuit of claim 14, wherein the user selected divide ratio is changed asynchronously to the clock signal and the output signal.

19. The PLL circuit of claim 14, further comprising:
   an anti-glitch circuit, coupled to said adjustable shift register for providing a glitch-free output signal.

20. The PLL circuit of claim 14, further comprising:
   a self-initialization circuit, coupled to said adjustable shift register, for preventing the adjustable shift register from entering into an inoperative state.

* * * * *